United States Patent

Takeuchi

[11] Patent Number: 6,005,805
[45] Date of Patent: Dec. 21, 1999

[54] NONVOLATILE SEMICONDUCTOR DEVICE WITH A VERIFY FUNCTION

[75] Inventor: Nobuyoshi Takeuchi, Tokyo, Japan

[73] Assignee: NKK Corporation, Japan

[21] Appl. No.: 08/731,555

[22] Filed: Oct. 16, 1996

Related U.S. Application Data

[63] Continuation of application No. 08/577,011, Dec. 22, 1995, abandoned.

[30] Foreign Application Priority Data

Dec. 27, 1994 [JP] Japan .................................. 6-338754

[51] Int. Cl.$^6$ ................................................. G11C 16/06
[52] U.S. Cl. .................................. 365/185.22; 365/185.2; 365/210
[58] Field of Search ..................... 365/185.22, 185.21, 365/185.2, 210

[56] References Cited

U.S. PATENT DOCUMENTS

| | | | |
|---|---|---|---|
| 4,223,394 | 9/1980 | Pathak et al. ............................ | 365/210 |
| 4,811,291 | 3/1989 | de Ferron ................................. | 365/185 |
| 4,833,514 | 5/1989 | Esquivel et al. ........................ | 357/23.5 |
| 5,068,697 | 11/1991 | Noda et al. .............................. | 357/23.5 |
| 5,134,583 | 7/1992 | Matsuo et al. ........................... | 365/200 |
| 5,142,496 | 8/1992 | Van Buskirk ............................ | 365/201 |
| 5,157,626 | 10/1992 | Watanabe ................................ | 365/185.2 |
| 5,163,021 | 11/1992 | Mehrotra et al. ........................ | 365/185 |
| 5,265,059 | 11/1993 | Wells et al. .............................. | 365/204 |
| 5,311,466 | 5/1994 | Natale et al. ............................ | 365/185.2 |
| 5,335,198 | 8/1994 | Van Buskirk et al. .................. | 365/185 |
| 5,343,434 | 8/1994 | Noguchi .................................. | 365/218 |
| 5,463,587 | 10/1995 | Maruyama .............................. | 365/210 |
| 5,465,231 | 11/1995 | Ohsaki ................................. | 365/185.33 |

OTHER PUBLICATIONS

Kobayashi et al "Memory Array Architecture and Decoding Scheme for 3V Only Sector Erasable DINOR Flash Memory" LSI Laboratory, Mitsubishi Electric Corporation—pp. 97–98.

Yamada et al A Self–Convergence Erasing Scheme for a Simple Stacked Gate Flash EEPROM IEDM 91–307 11.4.1–11.4.4.

*Primary Examiner*—David Nelms
*Assistant Examiner*—Hien Nguyen
*Attorney, Agent, or Firm*—Nixon & Vanderhye

[57] ABSTRACT

In a nonvolatile semiconductor memory device, flash memory cells are arranged in rows and columns and the individual memory cells $2nk$ are connected to word lines WLi and bit lines BLi. Further connected to the individual word lines WLi are verify cells $4n$ that are verified in place of the memory cells $2nk$ during the verification of the memory cells $2nk$. The memory cells $2nk$ and verify cells $4n$ are formed into almost the same EEPROM structure having a floating electrode, except that the gate couple ratio of the verify cells $4n$ are set smaller than that of the gate couple ratio of the memory cells $2nk$. Therefore, as long as electrons are injected sufficiently into these two types of cells, the threshold values of the verify cells $4n$ are always smaller than those of the memory cells $2nk$. Consequently, when it is confirmed that the verify cells $4n$ have been verified, this means that the memory cells have been verified as well.

8 Claims, 3 Drawing Sheets

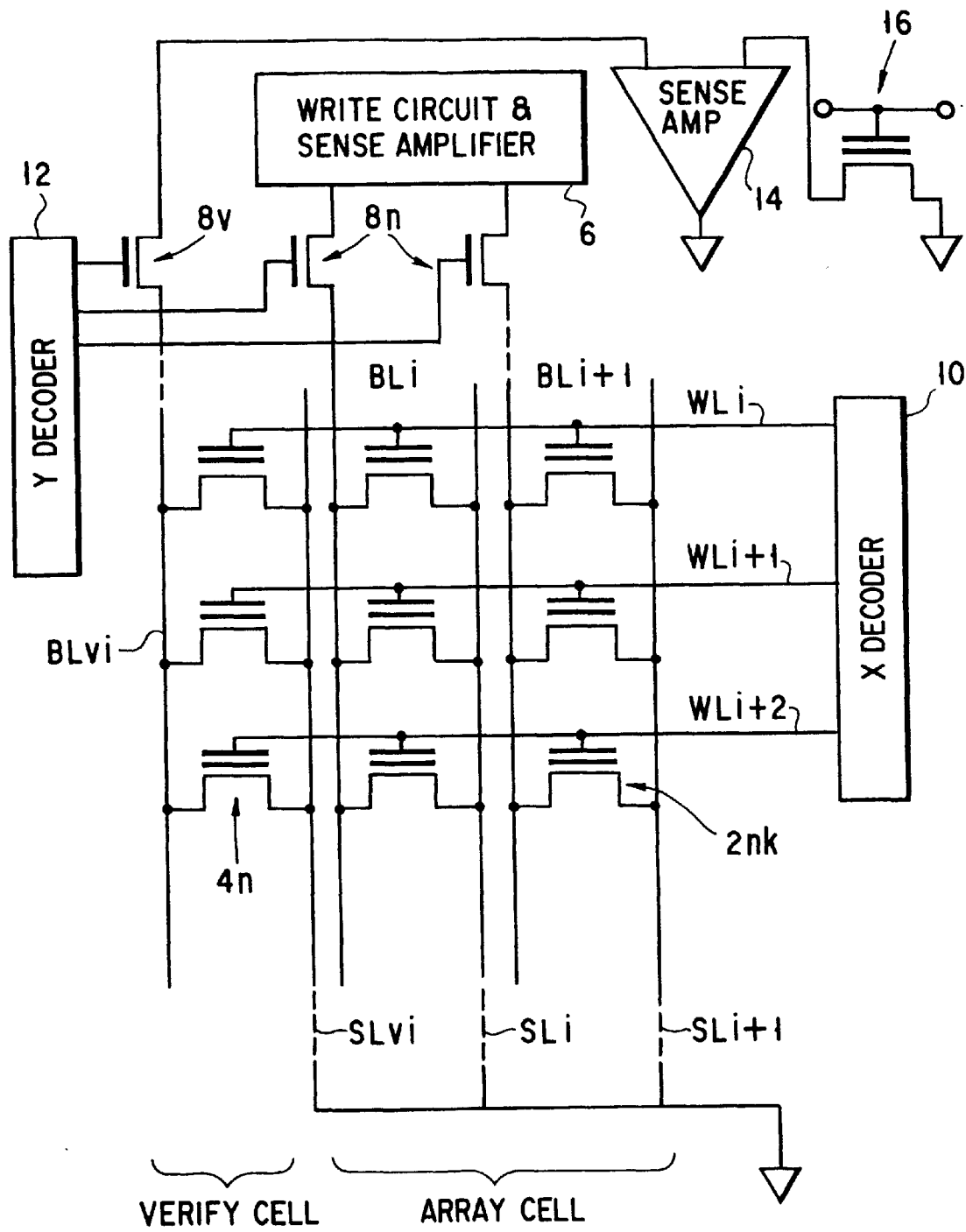
F I G. 1

F-N ELECTRON INJECTION CHARACTERISTIC

F-N ELECTRON EXTRACTION CHARACTERISTIC

HOT ELECTRON INJECTION CHARACTERISTIC

NONVOLATILE SEMICONDUCTOR DEVICE WITH A VERIFY FUNCTION

This is a continuation of application Ser. No. 08/577,011, filed Dec. 22, 1995, now abandoned.

BACKGROUND OF THE INVENTION

1. Field of the Invention

This invention relates to a nonvolatile semiconductor memory device with a verify function, and more particularly to a nonvolatile semiconductor memory device with memory cells for verification.

2. Description of the Related Art

With nonvolatile memories, such as EEPROMs or flash memories, it is necessary to verify whether the data has been written or erased correctly after the writing or erasing of the data. The verifying operation is termed verify. Verify is executed by comparing the current from the cell that has been written into or erased from with the current from a reference cell at a sense amplifier. In general, a write operation or an erase operation is carried out during a specific period of time and thereafter, a verify operation is executed. After the repetition of these operations has brought the current value of the cell into a specified value, the verify operation is terminated and the writing or erasing is completed.

Although the expression "the writing or erasing" is used here, a write operation is generally independent from an erase operation. In this connection, verify associated with a write operation is termed program verify, whereas verify related to an erase operation is termed erase verify.

As the degree of integration of flash memory is getting higher, the proportion of verification in a write or erase operation is getting larger, resulting in an increase in the time required to write or erase the data. Program verify, in particular, is a factor that hinders the reduction of the write time, because being executed bit by bit.

SUMMARY OF THE INVENTION

The object of the present invention is to provide a nonvolatile semiconductor memory device capable of remarkably shortening the write time and erase time of a highly integrated flash memory.

According to the invention, there is provided a nonvolatile semiconductor device comprising: a column line; a plurality of row lines which are crossed to the column line at crossing points; memory cells of floating gate type each of which is arranged at the crossing point; at least one verify cell which is arranged at the crossing point, the memory cells and verify cell constituting a memory cell array and the verify cell having a gate coupled ratio different from that of the memory cells; and verify means for verifying the verify cell.

According to the invention, there is also provided a nonvolatile semiconductor device comprising: a plurality of word lines; a plurality of bit lines which are crossed to the word lines at crossing points; a plurality of source lines; a group of memory cell transistors of floating gate type and verify cell transistors, each of the memory and verify cell transistors being arranged at the crossing point and having gate terminal and two electrode terminals which are connected to the word, bit and source lines, respectively; and verify means for verifying the verify cell transistors; wherein each of the verify cell transistors has a gate coupled ratio different from that of the corresponding memory cells, the gate terminals of the corresponding memory cells being connected to the common word line to which the each verify cell transistor is connected.

According to the present invention, there is further provided a nonvolatile semiconductor device with a verify function, comprising: a plurality of or preferably a large number of programmable flash memory cells arranged in rows and columns; word lines and bit lines connected to the memory cells arranged in rows and columns; verify cells which are arranged in parallel with the memory cells, connected to a common bit line, each connected to the word lines, each have the same structure of the memory cells, and have a gate couple ratio different from that of the memory cells; and verify means for verifying the verify cells.

According to an embodiment of the present invention, there is provided a nonvolatile semiconductor device characterize in that the verify means contains: means for selecting a word line; and means for reading via a bit line the output of the verify cell connected to the selected word line.

According to another embodiment of the present invention, there is provided a nonvolatile semiconductor device characterized in that the reading means contains: a reference cell for generating a reference signal; and a comparison circuit for comparing the reference signal from the reference cell with the output of the verify cell.

According to still another embodiment of the invention, there is provided a nonvolatile semiconductor device characterized in that the verify cells contain a first column of verify cells and a second column of verify cells arranged in parallel with the memory cells.

Because simply verifying the verify cells enables the memory cells connected to the word lines to be verified and a verify operation can be performed word line by word line, the verify time can be shortened remarkably.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is a block diagram of a nonvolatile semiconductor device according to an embodiment of the present invention;

DETAILED DESCRIPTION OF THE PREFERRED EMBODIMENT

Figure 2:
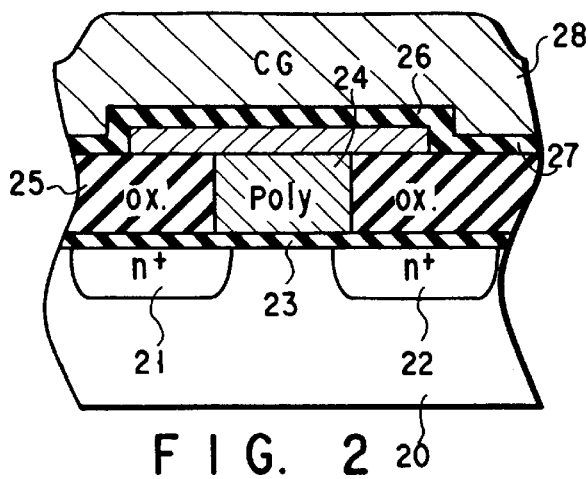
FIG. 2 is an exemplary schematic sectional view of a memory cell of FIG. 1.

Hereinafter, referring to the accompanying drawings, an embodiment of the present invention will be explained.

As shown in FIG. 1, in a nonvolatile semiconductor device according to an embodiment of the present invention, nonvolatile memory cells—flash memory cells 2nk which the bit data is written into and erased from—are arranged in X rows and Y columns. The semiconductor device is further provided with a column of verify cells 4n for verifying the flash memory cells 2nk of the X-row Y-column arrangement. The memory cells 2nk and verify cells 4n are formed into a floating gate memory structure having almost the same floating gates as explained later, and are manufactured so that the gate couple ratio of the memory cells differs from that of the verify cells. Each of the control of the memory cells 2nk and verify cells 4n are connected to an X decoder 10 via word lines WLi, WLi+1 WLi+2, . . . . The drains of the memory cells 2nk are connected to a write circuit and sense amplifier 6 via bit lines BLi, BLi+1, . . . and bit line select transistors 8n. The sources of the memory cells 2nk are connected to the ground via source lines SLi, SLi+1, . . . . . The gates of the bit line select transistors 8n are connected to a Y decoder 12.

The drains of the verify cells 4n are connected to a verify sense amplifier 14 via a bit line BLvi and a bit line select transistor 8v. Like the memory cells 2nk, the sources of the verify cells 4n are connected to the ground via a source line SLvi. The output side of a reference cell 16 having the same configuration as that of the memory cells 2nk or verify cells 4n is connected to the sense amplifier 14.

Figure 3:
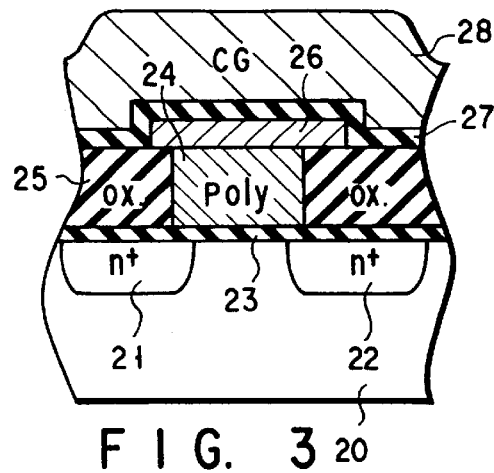
FIG. 3 is an exemplary schematic sectional view of a verify cell of FIG. 1.

The memory cells 2nk and verify cells 4n shown in FIG. 1 are formed into an EEPROM configuration as shown in FIGS. 2 and 3. Specifically, as shown in FIGS. 2 and 3, in these cells 2nk and 4n shown in FIGS. 2 and 3, n-type impurity ions are doped at the surface of a p-type silicon substrate 20, thereby forming a drain region 21 and a source region 22 as high-concentration impurity diffusion layers (n+). On the silicon substrate 20 containing the drain and source regions 21, 22, a tunnel oxide film 23 is formed. Above the channel region between the source and drain regions 21, 22 and on the tunnel oxide film 23, a floating gate 24 made of a polysilicon film is formed. On the tunnel oxide film 23, except for the floating gate 24, an interlayer insulating film 25 made of silicon oxide is formed.

A cap 26 made of polysilicon is formed so as to cover the exposed surface of the floating gate 24 and further the surface of the interlayer insulating film 25 above the drain and source regions 22, 21. On the surface of the cap 26 and interlayer insulating film 25, an ONO film 27 is formed as an insulating layer having a silicon oxide/silicon nitride-stacked structure. Furthermore, on the ONO film 27, a control gate 28 made of polysilicon is formed.

The memory cell 2nk of FIG. 2 differs from the verify cell 4n in the dimensions of the cap 26. Specifically, in the memory cell 2nk of FIG. 2, the cap 26 has a length of Lx1 in the direction in which the source region 22 and the drain region 21 are arranged side by side and a length of Ly1 in the direction perpendicular to the direction in which the source region 22 and the drain region 21 are arranged side by side, and has a near-rectangular cap area S1 of Lx1×Ly1. The verify cell 4n of FIG. 3 has a length of Lx2 in the direction in which the source region 22 and the drain region 21 are arranged side by side and a length of Ly2 in the direction perpendicular to the direction in which the source region and the drain region are arranged side by side, and has a near-rectangular cap area S2 of Lx2×Ly2. As seen from the comparison between FIG. 2 and FIG. 3, the cap length Lx1 of the memory cell 2nk is set larger than the cap length Lx2 of the verify cell 4n. The cap length Ly1 of the memory cell 2nk is set equal to the cap length Ly2 of the verify cell 4n.

As a result, the cap area S1 of the memory cell 2nk is larger than the cap area S2 of the verify cell 4n.

With the memory cell 2nk and verify cell 4n having the above-described configurations, the gate couple ratio of the verify cell 4n is set smaller than the gate couple ratio of the memory cell 2nk. The larger the capacitance between the channel region and the floating gate 24 and the capacitance between the floating gate 24 and the control gate 28, the greater the gate couple ratio. In the memory cell 2nk of FIG. 2 and the verify cell 4n of FIG. 3, because the area where the channel region faces the floating gate 24 is the same, the capacitance between the channel region and the floating gate 24 is equal in both cells. In contrast, in the memory cell 2nk and the verify cell 4n, the area S1 and area S2 where the floating gate 24 faces the control gate 28 differ from each other. The memory cell 2nk has the larger area S1 where the floating gate 24 faces the control gate 28 than the verify cell 4n. Consequently, the memory cell 2nk has the larger capacitance between the floating gate 24 and the control gate 28 than the verify cell 4n. The gate couple ratio of the memory cell 2nk is larger than the gate couple ratio of the verify cell 4n.

As described above, by incorporating in the semiconductor device the verify cells 4n having the gate couple ratio different from that of the memory cells 2nk and verifying the verify cells 4n, the memory cells 2nk for the word lines WLi, WLi+1, . . . connected to the verify cells 4n can be verified.

The aforementioned cells with different couple ratios are formed most easily by making a fine adjustment of the area of the tunnel oxide film portion of the cell and the surface area of the floating gate. Specifically, the structures shown in FIGS. 2 and 3 have been disclosed in U.S. Pat. No. 4,833, 514 issued to TI. If the shaded polysilicon cap in a verify cell is made shorter than that in an array cell by using a suitable photomask, it is apparent that a array cell with a smaller couple ratio will be achieved.

In general, the writing or erasing of data into or from the flash memory cells 2nk is effected by Fowler-Nordheim tunnel current (hereinafter, referred to as F-N current) or by hot electron injection (hereinafter, referred to as HE injection). When a verify cell 4n, gate couple ratio of which is smaller than that of an array memory cell 2nk, is prepared and the characteristic of injecting electrons into each floating gate 24, the characteristic of extracting electrons from each floating gate 24, and the characteristic of injecting hot electrons into each floating gate 24 are examined, the characteristic diagrams of FIGS. 4A, 4B, and 4C will be given. As seen from the FIGS. 4A, 4B, and 4C, the array cell with the larger couple ratio experiences the faster changes of the threshold value Vth in both cases of F-N current and HE injection and after a specific time has elapsed, the two types of cells have different threshold values. By simply verifying the writing of data into the verify cells 4n and the erasing of data from the verify cells 4n on the basis of the above property, the memory cells 2nk connected to the individual word lines WLi, WLi+1, . . . can be verified.

First, program verify will be described.

A write operation in the so-called "page mode programs" is first carried out. Specifically, a word line WLi is selected by the X decoder 10 and a write select voltage is applied to the word line WLi. At the same time, the Y decoder 12 selects the select transistors 8v, 8n connected to bit lines BLi, BLi+1, . . . of the memory cells 2nk to be written into and to bit line BLvi of the verify cells 4n, one of which is connected to the selected word line WLi and a write voltage is applied to the bit lines BLi, BLi+1, . . . and BLvi. In this way, the data, for example, "1", is written into the memory cells 2nk to be written into and the verify cell 4n. In the write operation, a select voltage and write voltage are applied for a specific period of time, thereby providing the memory cells 2nk and verify cell 4n with threshold values in specific ranges, respectively.

After the write operation, a verify operation is started. In the verify operation, the X decoder 10 selects the verify cell 4n of the word line WLi connected to the memory cells 2nk programmed, and a verify voltage is applied to the verify cell 4n. The verify voltage corresponds to the threshold voltage of the verify cell 4n programmed as explained later. Thereafter, the Y decoder 12 selects the select transistor 8v connected to the bit line BLvi. As a result, the output of the programmed verify cell 4n is supplied to the sense amplifier 14. In the verify operation, the reference cell 16 is also turned on and then supplies a reference output to the sense amplifier 14. The sense amplifier 14 compares the reference output with the output of the verify cell 4n. If the verify cell 4n has been programmed correctly, for example, the level of the output of the verify cell 4n will be higher than that of the reference output, causing the sense amplifier 14 to produce an output of "1" meaning that the verify cell has been programmed correctly. If the verify cell 4n has been programmed incorrectly, for example, the level of the output of the verify cell 4n will be lower than that of the reference output, causing the sense amplifier 14 to produce an output of "0" meaning that the verify cell has been programmed incorrectly.

Erase verify is performed in a similar manner to write verify as described below. An erase operation is carried out for each common source or common well. Specifically, as soon as an erase gate voltage is applied to the word lines WLi, WLi+1, . . . , an erase well voltage or erase voltage is applied to the common well or common source, or an erase well voltage and an erase voltage are applied to the common well or common source, respectively. In this way, the data is erased from the memory cells 2nk and verify cells 4n. In the erase operation, a select voltage and erase voltage are applied for a specific period of time, thereby providing the memory cells 2nk and verify cells 4n with threshold values in specific ranges, respectively.

After the erase operation, a verify operation is started. In the verify operation, the X decoder 10 selects one after another the verify cells 4n from which the data has been erased, and a verify voltage is applied to the verify cells 4n. The verify voltage corresponds to the threshold voltage of the verify cells 4n in an erase operation as explained later. After the Y decoder 12 has selected the select transistor 8v connected to the bit line BLvi, the output of the verify cell 4n from which the data has been erased is supplied to the sense amplifier 14. In the verify operation, the sense amplifier 14 compares the reference output of the on reference cell 16 with the output of the verify cell 4n. If the verify cell 4n has been erased properly, for example, the level of the output of the verify cell 4n will be lower than that of the reference output, causing the sense amplifier 14 to produce an output of "0" meaning that the verify cell has been programmed properly. If the verify cell 4n has not been erased, for example, the level of the output of the verify cell 4n will be higher than that of the reference output, causing the sense amplifier 14 to produce an output of "1" meaning that the verify cell has not been erased properly. In this way, each of the verify cells 4n is checked to see if it has been erased properly.

As described above, by verifying the verify cells 4n, the programming or erasing of the memory cells 2nk that share the verify cells 4n and word lines WLi is verified. This is based of the following reasons.

Figure 5A:
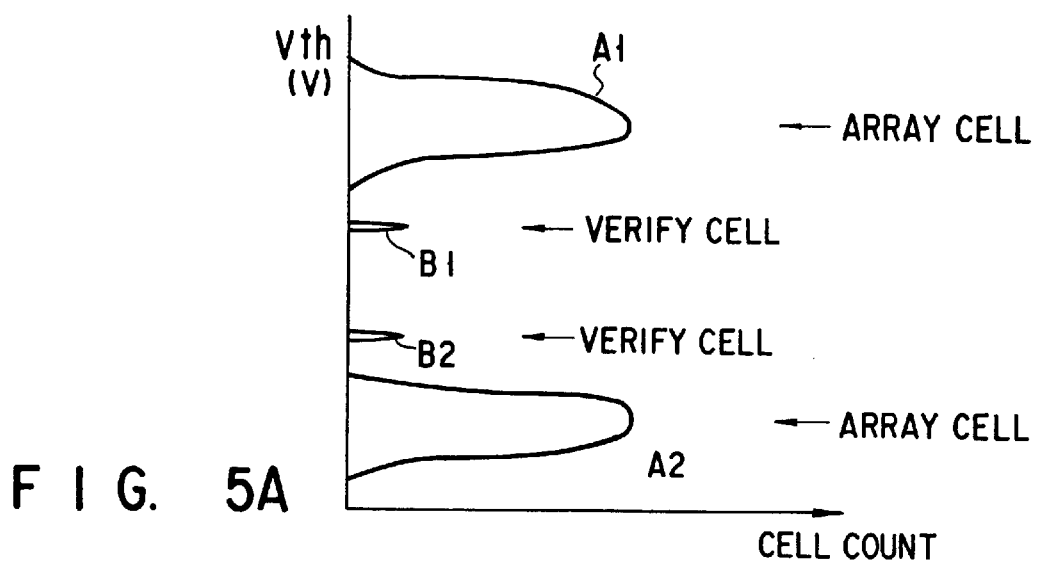
FIGS. 5A, 5B, and 5C each show the distribution of threshold values concerning a good many cells in the case where the gate couple ratio is change in a memory cell and a verify cell.

FIG. 5A shows a distribution of the threshold values of a great many cells, with the abscissa indicating the cell count corresponding to the number of cells and the ordinate indicating the threshold voltage Vth. Curves A1 and B1 represent the distribution of threshold values of the memory cells 2nk and verify cells 4n at a specific point in time when electrons are injected into the floating gates 24. Curves A2 and B2 represent the distribution of threshold values of the memory cells 2nk and verify cells 4n at a specific point in time when electrons are extracted from the floating gates 24.

Figure 4A:
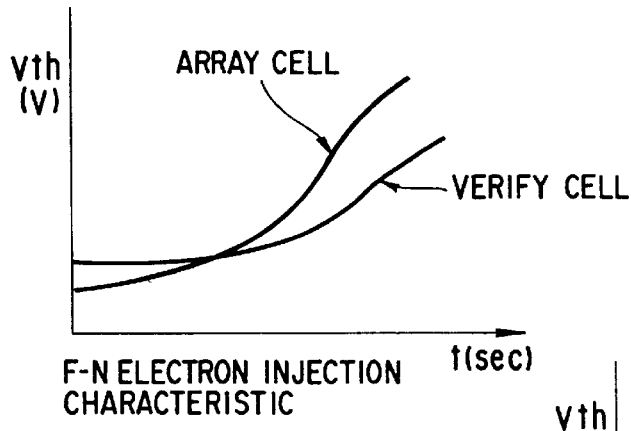
FIGS. 4A, 4B, and 4C show the electron injection characteristic, electron extraction characteristic, and hot electron injection characteristic of a memory cell and a verify cell, respectively.

As seen from FIG. 4A and curves A1 and B1 in FIG. 5A, in the case where electrons have been injected into the floating gate 24, when the threshold of the verify cell 4n has risen to a certain value, the threshold value of the memory cells 2nk whose couple ratio is larger than that of the verify cell have reached a higher threshold levels because the change of the threshold value of the memory cell is faster than that of the verify cell 4n. Therefore, examining whether the verify cell 4n conducts at that threshold value makes it unnecessary to check whether the memory cells 2nk corresponding to the verify cell 4n conducts at that threshold value, because the memory cell 2nk have a specific threshold values larger than the threshold value of the verify cell 4n.

Figure 4B:
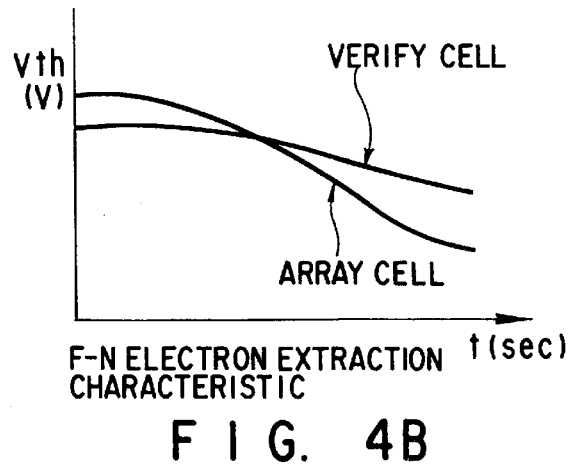
Figure 4C:
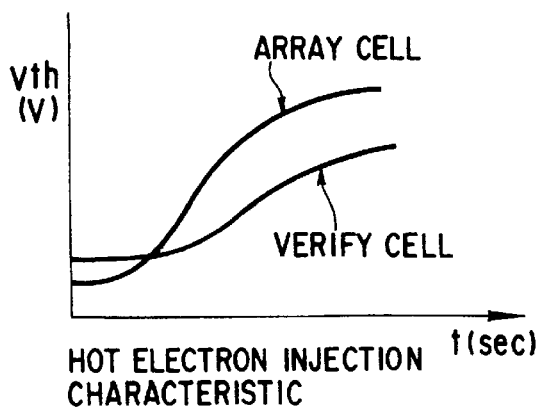

As seen from FIG. 4B and curves A2 and B2 in FIG. 5A, in the case where electrons are extracted from the floating gate 24, when the threshold value of the verify cell has dropped to a certain value, the array cell whose couple ratio is larger than that of the verify cell has reached a lower threshold value, because the change of the threshold value of the array cell is faster than that of the verify cell. Therefore, examining whether the verify cell 4n conducts at that threshold value makes it unnecessary to check whether the memory cells 2nk corresponding to the verify cells 4n conducts at that threshold value, because the memory cells 2nk have a specific threshold values smaller than the threshold values of the verify cells 4n. On the basis of the principle, just examining a single verify cell 4n for the bits sharing a word line WL guarantees the verification of the memory cells 2nk.

Even in the case where hot electrons are injected into the floating gate 4n, the same distributions as shown by curves A1 and B1 in FIG. 5A are given. Therefore, even in the case where the data is written into the memory cell 2nk by injecting hot electrons or where the data is erased, just verifying the verify cell 4n assures the verification of the memory cells 2nk.

In a case where the reference cell 16 is formed into the same cell type as that of the array memory cell 2nk and the couple ratio of the reference cell 16 is made equal to the couple ratio of the array memory cell 2nk, it is necessary to examine the sense ratio adjustment of the sense amplifier 14 in the TEG (Test Element Group) process to adjust the offset to the verify cell 4n. If the reference cell 16 is of the same type as that of the verify cell 4n, the adjustment will be easy.

On the basis of the above description, the following applications are possible.

(1) Verify cells 4n and a bit line associated therewith may be added, where the couple ratio of the additional cells 4n is larger than that of the array cells 2nk.

Figure 5B:
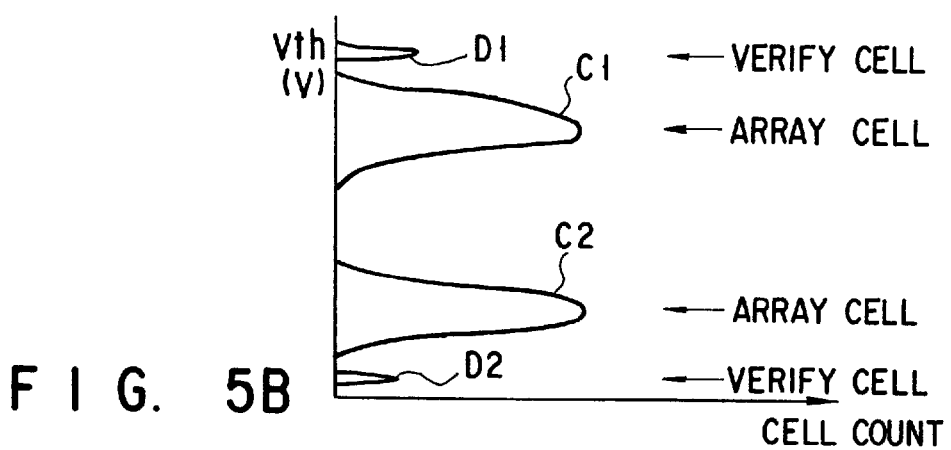
Figure 5C:
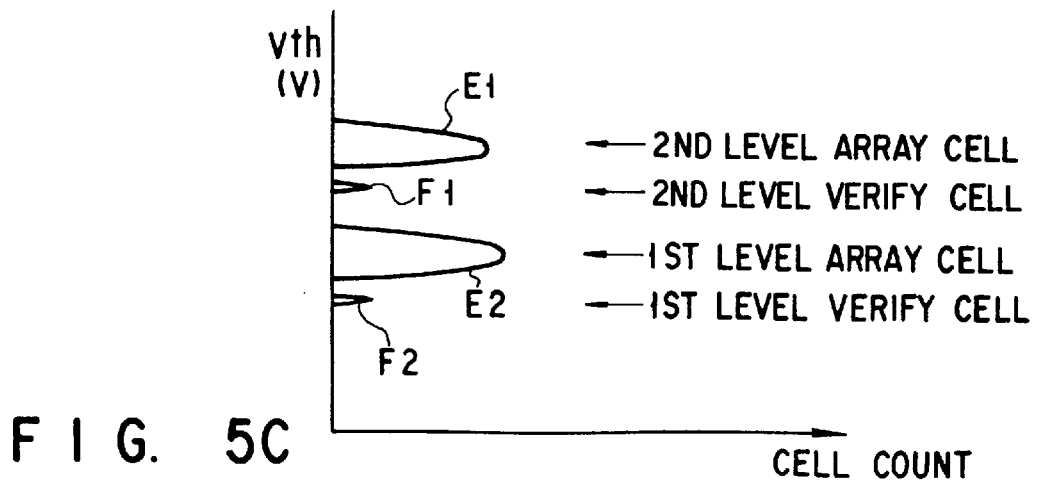

The verify cells 4n can be used to check overerasing or overprogramming. As shown in FIG. 5B, the threshold distributions of the verify cells 4n and array cells 2nk differ from those in FIG. 5A. Specifically, the relationship between the threshold values of the memory cells 2nk and that of the verify cell 4n at a point in time when electrons are injected into the floating gate 24 is as follows: when the threshold values of the memory cells 2nk have risen to a certain value, the verify cell 4n whose couple ratio is larger than that of the memory cells 2nk have reached higher threshold values, because the change of the threshold value of the verify cell is faster than that of the memory cells 2nk, as seen from curves C1 and D1. Furthermore, the relationship between the threshold value of the memory cells 2nk and that of the verify cell 4n at a point in time when electrons are extracted from the floating gate 24 is as follows: when the threshold value of the memory cells 2nk have decreased to a certain value, the verify cell 4n whose couple ratio is larger than that of the memory cells 2nk have reached a lower threshold value, because the change of the threshold value of the verify cell is faster than that of the memory cells 2nk, as seen from curves C2 and D2.

By making the couple ratio of the verify cells 4n of FIG. 1 larger than that of the array cells 2nk on the basis of the aforesaid property, the verify cells 4n can be used to check the overerasing and overprogramming of the memory cells 2nk.

(2) Two or more verify cells and bit lines associated therewith can be added to the circuit of FIG. 1 so as to put the memory cells 2nk is the circuit into two or more groups of memory cells having different threshold values. Such verify cells have couple ratios smaller than those of the memory cells 2nk.

With a multivalue memory where a voltage applied to the word lines is varied, a verify operation is carried out with the first verify cells using a first level and the second verify cells using a second level. At this time, the couple ratio of the first verify cells is not necessarily equal to that of the second verify cells.

Because program verify or erase verify can be performed using only the verify cells or the verify cell bit lines, the write time or erase time of a highly integrated flash memory can be shortened remarkably.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nonvolatile semiconductor device comprising:
   a column line;
   a plurality of row lines which are crossed to the column line at crossing points;
   memory cells of floating gate type each of which is arranged at the crossing point;
   at least one verify cell which is arranged at the crossing point, the memory cells and verify cell constituting a memory cell array and the verify cell having a gate coupled ratio different from that of said memory cells; and
   verify means for verifying the verify cell.

2. A nonvolatile semiconductor device comprising:
   a plurality of word lines;
   a plurality of bit lines which are crossed to the word lines at crossing points;
   a plurality of source lines;
   a group of memory cell transistors of floating gate type and verify cell transistors, each of the memory and verify cell transistors being arranged at the crossing point and having gate terminal and two electrode terminals which are connected to the word, bit and source lines, respectively; and
   verify means for verifying the verify cell transistors;
   wherein each of the verify cell transistors has a gate coupled ratio different from that of the corresponding memory cells, the gate terminals of the corresponding memory cells being connected to the common word line to which the each verify cell transistor is connected.

3. A nonvolatile semiconductor device according to claim 2, wherein said verify means contains:
   means for selecting a word line; and
   means for reading via a bit line the output of the verify cell connected to the selected word line.

4. A nonvolatile semiconductor device according to claim 3, wherein said reading means contains:
   a reference cell for generating a reference signal; and
   a comparison circuit for comparing the reference signal from the reference cell with the output of the verify cell.

5. A nonvolatile semiconductor device comprising:
   a plurality of programmable flash memory cells arranged in rows and columns;
   word lines and bit lines connected to said memory cells arranged in rows and columns;
   verify cells which are arranged in parallel with said memory cells, connected to a common bit line, each connected to said word lines, each have the same structure of said memory cells, and have a gate couple ratio different from that of said memory cells; and
   verify means for verifying said verify cells.

6. A nonvolatile semiconductor device according to claim 5, wherein said verify means contains:
   means for selecting a word line; and
   means for reading via a bit line the output of the verify cell connected to the selected word line.

7. A nonvolatile semiconductor device according to claim 6, wherein said reading means contains:
   a reference cell for generating a reference signal; and
   a comparison circuit for comparing the reference signal from the reference cell with the output of the verify cell.

8. A nonvolatile semiconductor device according to claim 5, wherein said verify cells contain a plurality columns of verify cells arranged in parallel with the memory cells.

* * * * *